United States Patent
Joffe et al.

(10) Patent No.: US 8,901,475 B1
(45) Date of Patent: Dec. 2, 2014

(54) AVALANCHE PHOTODIODE BIASING SYSTEM INCLUDING A CURRENT MIRROR, VOLTAGE-TO-CURRENT CONVERTER CIRCUIT, AND A FEEDBACK PATH SENSING AN AVALANCHE PHOTODIODE VOLTAGE

(75) Inventors: Daniel Joffe, Owens Crossroads, AL (US); Phillip Herron, Madison, AL (US)

(73) Assignee: ADTRAN, Inc., Huntsville, AL (US)

( * ) Notice: Subject to any disclaimer, the term of this patent is extended or adjusted under 35 U.S.C. 154(b) by 70 days.

(21) Appl. No.: 13/538,850

(22) Filed: Jun. 29, 2012

(51) Int. Cl.
*H01J 40/14* (2006.01)
*H03F 3/08* (2006.01)

(52) U.S. Cl.
USPC ................................ 250/214 R; 250/214 A

(58) Field of Classification Search
USPC ..... 250/208.1, 214.1, 214 R, 214 A, 214 LA, 250/214 LS, 214 AG, 214 C, 214 DC, 250/214 VT; 398/93, 162, 195, 201, 206, 398/207, 209, 212–214; 359/51, 54, 56, 61, 359/65, 67, 89, 95, 96, 132; 257/186, 431, 257/603; 327/53, 54, 66, 67, 100, 103
See application file for complete search history.

(56) References Cited

U.S. PATENT DOCUMENTS

| | | | |
|---|---|---|---|
| 4,438,348 A | 3/1984 | Casper et al. | |
| 4,479,052 A | 10/1984 | Suzuki | |
| 4,730,128 A | 3/1988 | Seki | |
| 5,696,657 A | 12/1997 | Novrreier et al. | |
| 6,157,022 A | 12/2000 | Maeda et al. | |
| 6,894,266 B2 | 5/2005 | Richard et al. | |
| 6,919,716 B1 | 7/2005 | Buehler | |
| 7,087,882 B1 | 8/2006 | Dries et al. | |
| 7,265,333 B2 * | 9/2007 | Ichino et al. | 250/214 R |
| 7,761,013 B2 | 7/2010 | Futami | |
| 2003/0178552 A1 | 9/2003 | Hofmeister et al. | |
| 2005/0174248 A1 * | 8/2005 | Woods et al. | 340/661 |

OTHER PUBLICATIONS http://datasheets.maxim-ic.com/en/ds/MAX1932.pdf, "MAXIM Digitally Controlled, 0.5% Accurate, Safest APD Bias Supply.", Dec. 2002.
http://datasheets.maxim-ic.com/en/ds/DS1842.pdf, "MAXIM 76V, APD, Bias Output Stage with Current Monitoring.", Mar. 2011.
http://datasheets.maxim-ic.com/en/ds/MAX15059.pdf, "MAXIM 76V, 300mW Boost Converter and Current Monitor for APD Bias Applications.", May 2010.

\* cited by examiner

*Primary Examiner* — Georgia Y Epps
*Assistant Examiner* — Don Williams
(74) *Attorney, Agent, or Firm* — Maynard, Cooper & Gale, P.C.; Jon E. Holland

(57) ABSTRACT

A system has a current mirror that has an input node and an output node and an avalanche photodiode (APD) coupled to the output node of the current mirror. The system also has a nonlinear voltage-to-current conversion element coupled to the input node of the current mirror that transmits current through the current mirror and the APD. Further, the system has a feedback path coupled between the output node of the current mirror and the voltage-to-current conversion element that senses a voltage across the APD and provides, based on the sensed voltage, an input signal to the voltage-to-current conversion element for controlling the element's output current, and the feedback path is arranged to limit a voltage of the input signal such that the output current is limited thereby preventing damage to the APD.

15 Claims, 5 Drawing Sheets

AVALANCHE PHOTODIODE BIASING SYSTEM INCLUDING A CURRENT MIRROR, VOLTAGE-TO-CURRENT CONVERTER CIRCUIT, AND A FEEDBACK PATH SENSING AN AVALANCHE PHOTODIODE VOLTAGE

BACKGROUND

Avalanche photodiodes (APDs) are often used in optical systems to sense optical data signals. In this regard, an APD is typically a high-speed, highly sensitive semiconductor device that uses the photoelectric effect to convert light to electricity. In operation, photon or light impact from an optical data signal creates hole-electron pairs within the APD, and the APD operates under a high reverse bias condition to enable avalanche multiplication of the holes and electrons. The avalanche action enables the gain of the diode to be significantly increased, providing a much greater level of sensitivity. Thus, the sensitivity of the APD is directly related to and controlled by the bias voltage that is applied across it, i.e., the higher the bias voltage applied, the higher the gain of the APD.

In order to enhance the sensitivity of an APD, it is generally desirable to provide a bias voltage that is close to the breakdown voltage of the APD, but the breakdown voltage varies with temperature and process. Accordingly, to keep the bias voltage within a desired range of the breakdown voltage, it is possible to measure the current flowing through the APD and to adjust the bias voltage based on such current. Accurately sensing the APD current and controlling the bias voltage based on the sensed current may enhance the performance and, specifically, the sensitivity of the APD.

Various conventional circuit designs for measuring the APD current and controlling the bias voltage suffer from accuracy problems and/or provide insufficient and/or after the fact current limiting for the APD, thereby exposing the APD to possible damage from high currents flowing through the APD. Improved circuits for accurately sensing APD current and providing reliable protection from high currents are generally desired.

DESCRIPTION OF DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the figures.

DESCRIPTION

The present disclosure generally relates to systems and methods for biasing avalanche photodiodes. An exemplary embodiment of a system for biasing avalanche photodiodes comprises a current mirror having an input node and an output node. An avalanche photodiode (APD) is coupled to the output node, and a nonlinear voltage-to-current conversion element is coupled to the input node such that the current supplied to the APD is equal to or proportional to the current passing into the input node of the current mirror. That current is limited by any of a number of means as described in this application. Additionally, a feedback path is coupled to the output node. This feedback path senses the voltage across the APD that is combined with a reference signal to provide an input signal to the nonlinear voltage-to-current conversion element that feeds the input of the current mirror. The nonlinear voltage-to-current conversion element and current mirror acting with the feedback signal and system cause a desired voltage to appear across the APD while assuring that the APD current is a-priori limited to levels that do not cause it harm.

The nonlinear voltage-to-current conversion element determines the current to be supplied to the APD through the current mirror based upon the input signal. The output of the voltage-to-current conversion element is nonlinear in that it varies linearly with the input signal across an operating range, but a point is reached at which the output is limited (i.e., further increases are prevented). In particular, as the voltage of the input signal increases, the output current of the voltage-to-current conversion element increases linearly, but the voltage of the input signal is limited such that it is prevented from exceeding a threshold voltage. Thus, the output current of the nonlinear voltage-to-current conversion element (which is based on the input voltage) is limited to a level that prevents the current from damaging the APD. Accordingly, the system of the present disclosure provides accurate biasing of the APD while at the same time inherently limiting the APD current based on the current limiting in the nonlinear voltage-to-current conversion element. The described operation of the nonlinear voltage-to-current conversion element may be referred to as "piecewise linear."

Figure 1:
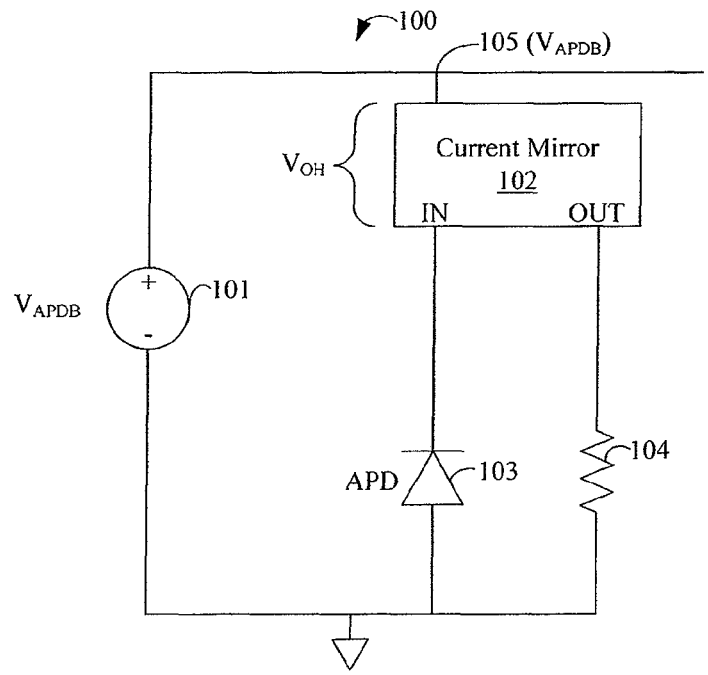
FIG. 1 is a circuit diagram illustrating a conventional system for providing a bias voltage to an avalanche photodiode (APD).

FIG. 1 depicts a conventional system 100 for supplying an avalanche photodiode (APD) with a bias voltage. The system 100 comprises an APD 103 and a voltage source $V_{APDB}$ (Avalanche Photodiode Bias Voltage) 101 for supplying a bias voltage to the APD 103.

The APD 103 is a semiconductor device that uses avalanche multiplication to provide gain and uses the photoelectric effect to convert light into electricity. The APD 103 is often used in optical communication for receiving an optical signal and converting the received optical signal into an electrical signal. As the reverse bias voltage of the APD approaches its breakdown voltage, hole-electron pairs resulting from absorbed photons create additional hole-electron pairs when they collide with ions in the semiconductor material resulting in signal gain.

The conventional system 100 further comprises a current mirror 102. The current mirror 102 generates, at its output node ("OUT"), an in-flow or out-flow current that is a copy (i.e., replicate) or proportional to an input current flowing into or out of its input node ("IN"). A typical current mirror 102 is designed to have unity gain such that the current at the output node is equal to the current at the input node, but it is possible for the current mirror 102 to have other gains, if desired.

The current mirror 102 has certain theoretical characteristics. In this regard, the input impedance at the input node ("IN") is low and ideally zero (0). Further, the output impedance at the output node ("OUT") is high and ideally infinite (∞). Practically, however, the actual input impedance is not quite zero (0), and there is often a small overhead voltage ($V_{OH}$) across the input of the current mirror 102.

The current flowing through the APD 103 is controlled so that the voltage across the APD 103 is slightly below the breakdown voltage of the APD 103. In this regard, a typical system 100 has circuitry (not shown in FIG. 1) for sensing the current flowing through the APD 103. Such typical circuitry, adjusts the voltage provided by the voltage source 101 based on the sensed current in an effort to maintain the bias voltage $V_{APDB}$ at or near the appropriate level for providing the desired voltage across the APD 103.

Notably, the circuit 100 does not directly set the APD voltage. In this regard, the circuit 100 sets the voltage at node 105, and the voltage at node 105 differs from the APD voltage by the overhead voltage ($V_{OH}$), which varies with temperature. Thus, there is inherent lack of control over the APD voltage due to the influence of the overhead voltage ($V_{OH}$) on the APD bias voltage.

Figure 2:
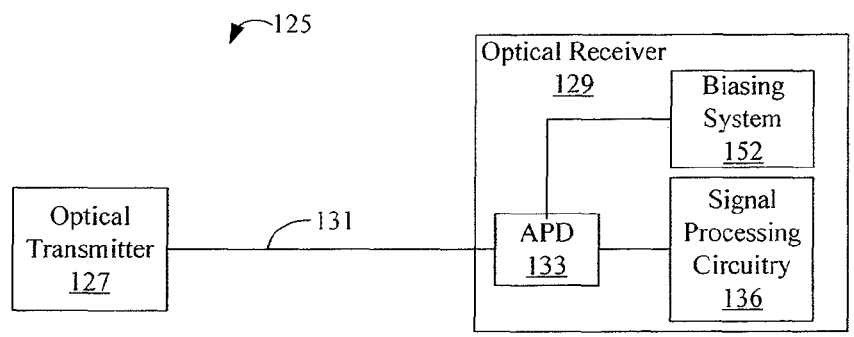
FIG. 2 is a block diagram illustrating an exemplary embodiment of an optical communication system.

FIG. 2 depicts an optical communication system 125 having an optical transmitter 127 that is coupled to an optical receiver 129 via an optical fiber 131. As shown by FIG. 2, the optical receiver 129 has an avalanche photodiode (APD) 133 that is coupled to an end of the optical fiber 131 and signal processing circuitry 136. The APD 133 is also coupled to an APD biasing system 152 that is configured to bias the APD 133, thereby controlling the sensitivity of the APD 133. In this regard, the APD biasing system 152 controls a bias voltage across the APD 133 such that the bias voltage is close to the breakdown voltage of the APD 133 to achieve avalanche multiplication of the holes and electrons within the APD 133, as described above.

In operation, the optical transmitter 127 transmits an optical data signal across the fiber 131 to the optical receiver 129. The APD 133 receives the optical data signal and converts the optical data signal into an electrical data signal. The signal processing circuitry 136 then processes the electrical data signal.

Figure 3:
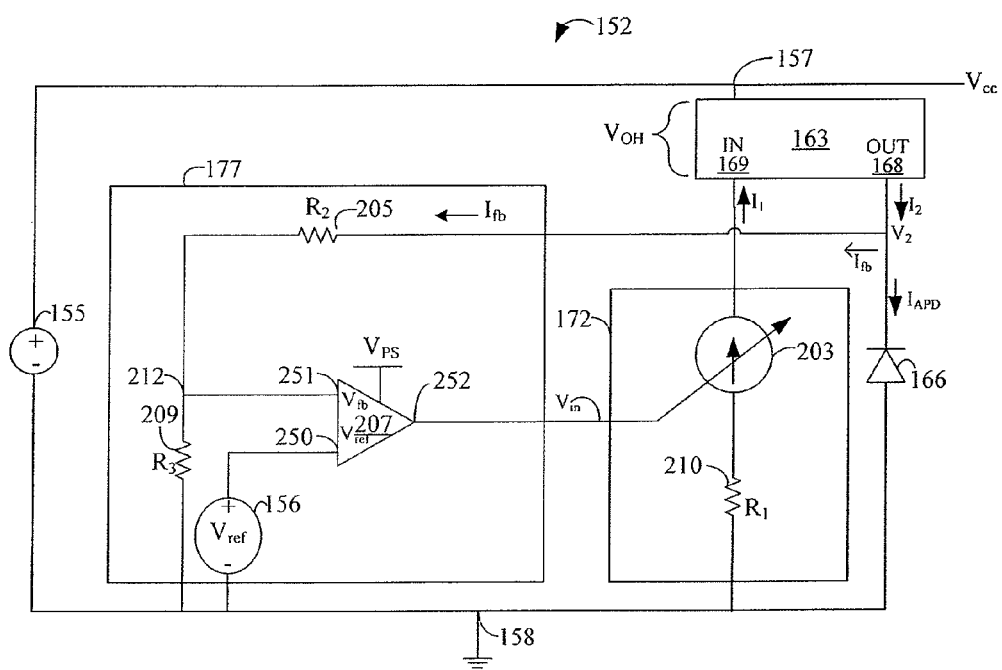
FIG. 3 is a circuit diagram illustrating an exemplary embodiment of a system for providing a current-limited bias voltage to an APD, such as is depicted by FIG. 2.

FIG. 3 depicts an exemplary embodiment of an APD biasing system 152 in accordance with an embodiment of the present disclosure. The APD biasing system 152 comprises an APD 166, a current mirror 163, a voltage-to-current conversion element 172, and a feedback path 177. The voltage-to-current conversion element 172 comprises a voltage-to-current converter 203 and a resistor 210. The voltage-to-current conversion element 172 is driven by a differential amplifier 207, which is powered from a supply voltage $V_{ps}$. The output 252 of the differential amplifier 207 can go no higher than $V_{ps}$. This places a limit on the current generated by the voltage-to-current conversion element 172. Thus, in FIG. 3, $V_{ps}$ places a limit on the maximum current that can be delivered to the APD 166. In other embodiments, other arrangements of nonlinear elements may be used to limit the voltage delivered to the voltage-to-current conversion element 172, thereby limiting the maximum current to the APD 166. Further, the APD biasing system 152 comprises a voltage source 155 that provides a voltage ($V_{oc}$) across a node 157, referred to hereafter as "positive rail," and a ground node 158. In addition, the APD biasing system 152 comprises a reference voltage source 156, which is described further herein.

The current mirror 163 is coupled to the positive rail 157. The current mirror 163 has an output node 168 ("OUT") that is coupled to the cathode end of the APD 166. Further, the anode end of the APD 166 is coupled to the ground node 158. The current mirror 163 also has an input node 169 ("IN"), and the input node 169 is coupled to the ground node 158 through nonlinear (or, more specifically, piecewise linear) voltage-to-current conversion element 172.

For illustrative purposes, it is assumed hereafter, unless otherwise indicated, that the gain of the current mirror 163 is equal to one, i.e., the current mirror 163 exhibits unity gain. Thus, the input current $I_1$ entering the input node 169 is approximately equal to the output current $I_2$ exiting the output node 168. However, it should be emphasized that it is possible for the current mirror 163 to have a non-unity gain in other embodiments, if desired. If such non-unity gain is exhibited by the current mirror 163, the input current $I_1$ is proportional to the output current $I_2$.

In one embodiment, the voltage-to-current conversion element 172 receives a voltage input $V_{in}$ derived from the feedback path 177 and generates an output current $I_1$ such that the mapping of the input voltage $V_{in}$ to the output current $I_1$ is piecewise linear. The piecewise linear result derives from a combination of a nonlinear voltage limiting element and an essentially linear voltage-to-current converter 203.

More specifically, the feedback path 177 senses a voltage across the APD 166, and the input voltage $V_{in}$ is varied based on comparisons of the sensed voltage to a reference voltage. As the input voltage $V_{in}$ increases, the output current $I_1$ increases linearly. However, the input voltage $V_{in}$ is limited such that a point is reached at which further increases in the input voltage $V_{in}$ and, hence output current $I_1$ are prevented regardless of the value of the sensed voltage. Thus, the combination of the nonlinear voltage limiting and an essentially linear voltage-to-current converter 203 maintains the output current $I_1$ at (or near) its current limit until the input voltage $V_{in}$ decreases from its voltage limit. When the input voltage $V_{in}$ called for by the feedback system drops below $V_{ps}$, the voltage-to-current conversion element 172 linearly decreases the output current $I_1$.

In one embodiment, the current limit of the combined nonlinear voltage limiting and essentially linear voltage-to-current converter 203 is set sufficiently low to ensure that the APD 166 is not damaged by the $I_{APD}$. The amount of current that may damage the APD 166 typically depends upon the type of APD i.e., different types of APDs have different current limits and tolerances. Thus, the limit may vary in different embodiments of the APD biasing system 152 depending on the characteristics of the APD 166.

Note that there are various techniques that can be used to limit the voltage of $V_{in}$ and, hence, the output current $I_1$ of the element 172. In the exemplary embodiment depicted by FIG. 3, such limits are realized via saturation of a differential amplifier 207. Such differential amplifier 207 comprises an input terminal 251 and an output terminal 250. The input terminal 251, often referred to as the "inverting terminal," is coupled to the feedback path 177. Additionally, an input terminal 250, often referred to as the "non-inverting terminal," is coupled to the reference voltage source 156. The voltage at the inverting terminal 251 is a fraction of the voltage $V_2$ present at the output node 212 of the feedback path 177 based on the resistance values of resistor $R_2$ 205 and resistor $R_3$ 209, which form a voltage divider. The output terminal 252 of the differential amplifier 207 is electrically coupled to the voltage-to-current conversion element 172, and the differential amplifier 207 is powered by a voltage $V_{ps}$ from a power source (not shown). In one embodiment, the differential amplifier 207 is implemented as an operational amplifier, described by the equation:

$$V_{in}=(V_+-V_-)G, \text{ for } V_{in}<V_{ps} \text{ and } V_{in}>0$$

where $V_+$ is the voltage of the non-inverting terminal 250 (which is also referred to as $V_{ref}$), $V_-$ is the voltage of the inverting terminal 251 (which is a fraction of the voltage at node 212), and G is the gain of the differential amplifier 207.

The voltage input $V_{in}$ provided to the voltage-to-current converter 203 of the conversion element 172 varies based upon samples of a voltage $V_2$ sensed at the output node 168 of the current mirror 163. In this regard, as described the voltage of the input terminal 251 is a fraction of and, thus, proportional to the voltage $V_2$ of the output node 168. When the voltage of the input terminal 251 is greater than a predetermined reference voltage $V_{ref}$ supplied by voltage source 156, the differential amplifier 207 decreases its output voltage, thereby decreasing $V_{in}$, and the voltage-to-current conversion element 172 decreases the input current $I_1$ entering the input node 169 of the current mirror 163. When the voltage-to-current conversion element 172 decreases $I_1$, the output current $I_2$ of the current mirror 163 decreases resulting in a decrease of $V_2$ and the current $I_{APD}$ passing through the APD 166.

If the voltage of the input terminal 251 is instead less than the reference voltage $V_{ref}$, the differential amplifier 207 increases its output voltage $V_{in}$, which increases the input current $I_1$ entering the input node 169 of the current mirror 163 provided that such voltage $V_{in}$ is less than $V_{ps}$. When the voltage-to-current conversion element 172 increases $I_1$, the output current $I_2$ of the current mirror 163 increases resulting in an increase of $V_2$ and the current $I_{APD}$ passing through the APD 166.

However, once $V_{in}$ reaches $V_{ps}$, then $V_{in}$, and hence $I_1$ is prevented from further increases regardless of the sensed voltage of $V_2$ and, more specifically, the voltage of the input terminal 251. In this regard, the APD biasing system 152 allows the output current of the voltage-to-current converter 203 to increase based on the differential input voltage across the terminals 250 and 251 up to the point of saturation of the differential amplifier 207. Once the differential amplifier 207 saturates, its output voltage no longer increases regardless of such differential input voltage, thereby limiting the voltage of the output node 252 and, hence, limiting the current output by the voltage-to-current converter 203. As will be described in more detail below, limiting the output current of the voltage-to-current converter 203 ultimately limits the current $I_{APD}$ passing through the APD 166. Thus, the APD voltage is allowed to fluctuate in the linear operating range of the voltage-to-current converter 203 in order to set the APD voltage close to its breakdown voltage while the current limit provided by the input voltage $V_{in}$ 252 from the differential amplifier 207 (which is limited to be less than $V_{ps}$) ensures that the APD 166 is not damaged.

Further, since the feedback path 177 senses the bias voltage $V_2$ directly at the output node 168, the bias voltage $V_2$ is not offset by the overhead voltage $V_{OH}$ of the current mirror 163, as described with reference to the conventional system 100. Therefore, the APD biasing system 152 provides more precise control of the APD's sensitivity relative to an embodiment that biases the APD 166 with a voltage across ground 158 and the positive rail 157.

Based on the input voltage $V_{in}$ provided to the nonlinear voltage-to-current conversion element 172, the voltage-to-current conversion element 172 outputs a current $I_1$ that is proportional to $I_2$, which is closely related to the current $I_{APD}$ passing through the APD 166. In this regard, $I_2$ is equal to the sum of $I_{APD}$ and the current $I_{fb}$ passing through the feedback path 177. Note that $I_{fb}$ can be kept small by selection of appropriate feedback element components such that $I_2$ is substantially equal to $I_{APD}$. In such case, the input current $I_1$ provided by the nonlinear voltage-to-current conversion element 172 is effectively proportional (i.e., equal in the instant embodiment in which the current mirror 163 has unity gain) to the current $I_{APD}$ passing through the APD 166. Notably, since the voltage measurement used by the nonlinear voltage-to-current conversion element 172 for controlling $I_1$ is ground-referenced, the measurement is relatively accurate compared to other solutions that may use voltage measurements that are not referenced to ground.

In the exemplary embodiment described above with reference to FIG. 3, the current limiting is achieved through saturation of the differential amplifier 207. In other embodiments, other techniques for limiting the current output by the voltage-to-current conversion element 172 and, hence, the current passing through the APD 166 are possible.

Figure 4:
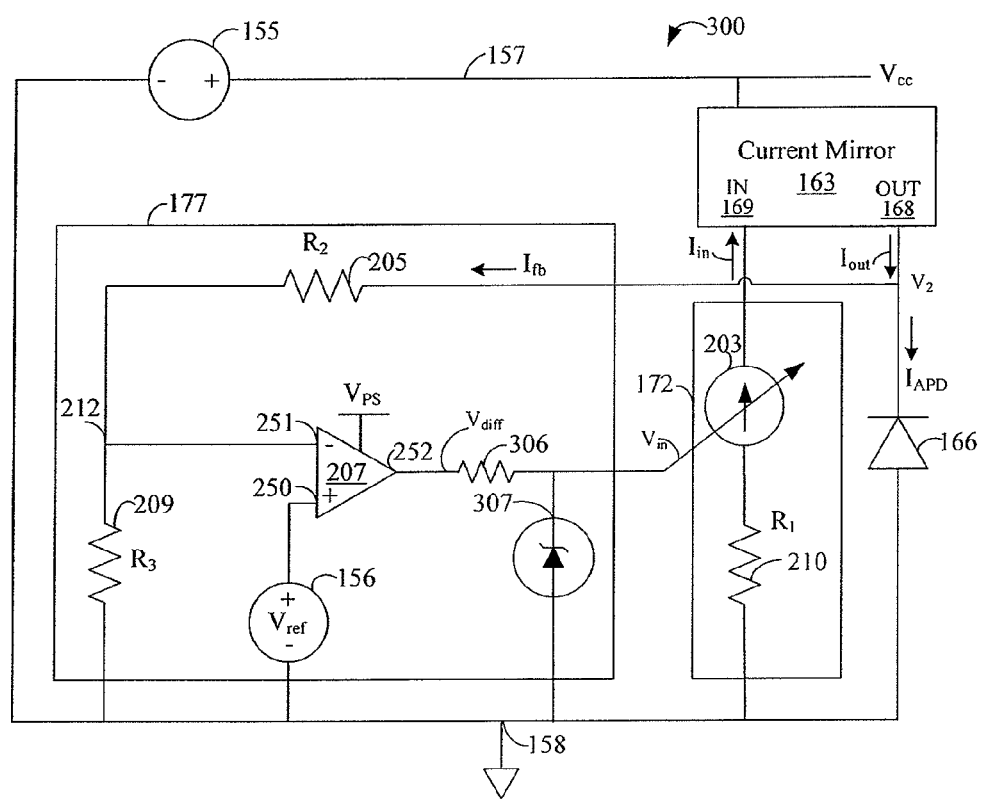
FIG. 4 is a circuit diagram illustrating an exemplary embodiment of a system for providing a current-limited bias voltage to an APD, such as is depicted by FIG. 2.

For example, FIG. 4 depicts an embodiment that has a Zener diode 307 for limiting the output current of the voltage-to-current conversion element 172. As shown by FIG. 4, the resistor $R_4$ 306 and Zener diode 307 are coupled in series and are connected to the output terminal 252 of the differential amplifier 207. The presence of such components limits the input voltage $V_{in}$ provided to the voltage-to-current conversion element 172 and, hence, the input current $I_{in}$ provided to the current mirror 163. Such limiting of the current $I_{in}$ limits the current through the APD ($I_{APD}$) to a value less than what would otherwise be limited based on the transconductance of the voltage-to-current conversion element 172 and $V_{ps}$.

In this regard, the Zener diode 307 inherently has a breakdown voltage, i.e., a voltage at which the Zener diode 307 begins to allow current to flow to the ground node 158. Thus, when the voltage $V_{in}$ reaches the breakdown voltage of the Zener diode 307, the Zener diode 307 begins to conduct current, and a portion of the current from the output node 252 of the differential amplifier 207 is redirected to ground. Such redirection results in a reduction of the voltage presented to voltage-to-current conversion element 172 thereby limiting the voltage $V_{in}$ of the input signal to the voltage-to-current conversion element 172 and, hence, the current output from the voltage-to-current conversion element 172. Thus, the Zener diode 307 controls the input signal to the voltage-to-current conversion element 172 such that the current $I_{out}$ flowing from the output node 168 of the current mirror 163 to the APD 166 is limited.

Figure 5:
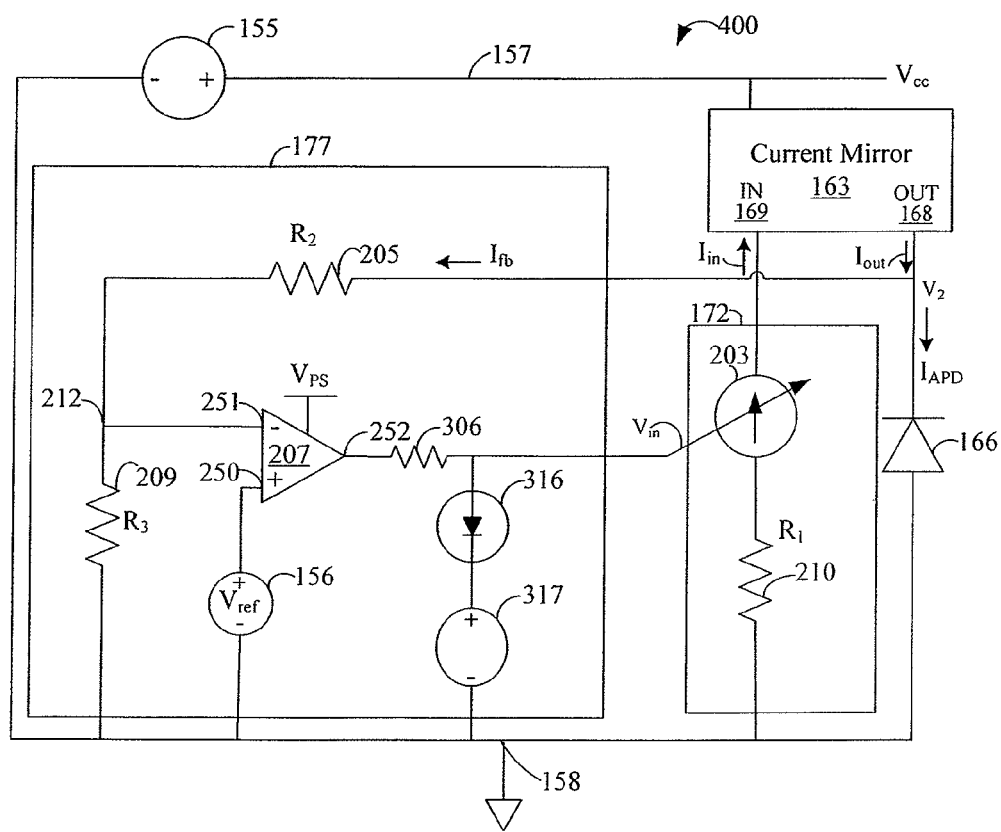
FIG. 5 is a circuit diagram illustrating another exemplary embodiment of a system for providing a current-limited bias voltage to an APD where the current limiting is provided by a zener diode acting at the input of a voltage-to-current conversion element.

FIG. 5 depicts another embodiment of an APD biasing system 400. Such an embodiment further comprises a diode 316 and voltage source 317. The diode 316 and voltage source 317 are coupled in series, and the output of the diode 316 is coupled to the voltage-to-current conversion element 172 for controlling the current output by the voltage-to-current conversion element 172.

In this regard, when the voltage $V_{in}$ to the voltage-to-current conversion element 172 is greater than $V_D+V_{BIAS}$, where $V_D$ is the voltage drop across the diode 316 and $V_{BIAS}$ is the voltage provided by the voltage source 317, a portion of the current from the differential amplifier output terminal 252 flows through the diode 316 to ground. This limits the voltage $V_{in}$ provided to the voltage-to-current conversion element 172. By limiting the voltage $V_{in}$ of the input signal for controlling the voltage-to-current conversion element 172, the current flow through the current mirror 163 to the APD 166 from the voltage-to-current conversion element 172 is limited.

As described above, the current from the voltage-to-current conversion element 172 is close to $I_{APD}$, assuming that the gain of the current mirror 163 is equal to one, but such current is not precisely equal to $I_{APD}$ due to the presence of the current $I_{fb}$ of the feedback path 177. In this regard, the current output from the voltage-to-current conversion element 172 is equal to the sum of $I_{fb}$ and $I_{APD}$. If desired, to provide a more accurate control of $I_{APD}$, the feedback path 177 may be configured to compensate for $I_{fb}$.

Figure 6:
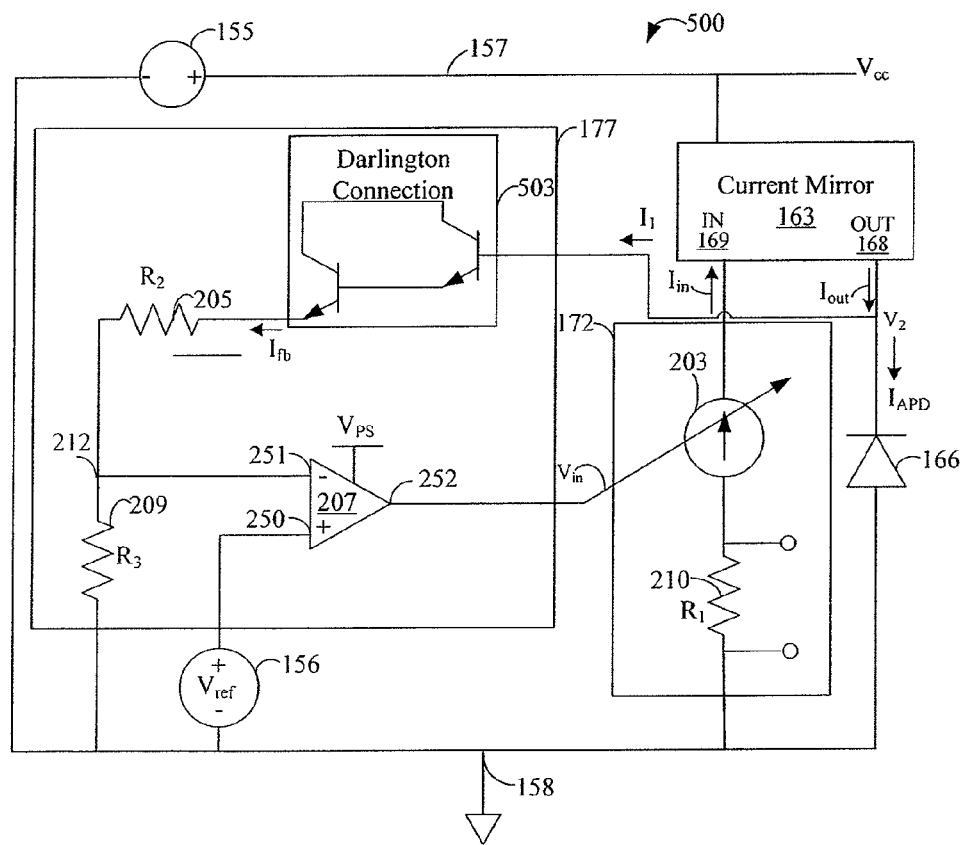
FIG. 6 is a circuit diagram illustrating another exemplary embodiment of a system for providing a bias voltage to an APD where the current is limited by a diode in series with a bias voltage source acting on the input of a voltage-to-current conversion element.

FIG. 6 depicts an exemplary embodiment of an APD biasing system 500 that is configured to greatly reduce the effects of the component $I_{fb}$ in the control of $I_{APD}$. To that end, the APD biasing system 500 comprises a Darlington connection 503 in the feedback path 177. In particular, the Darlington connection 503 is between the output node 168 of the current mirror 163 and the resistor 205 of the feedback path 177. In the system 500 shown by FIG. 6, the current $I_1$ input to the Darlington connection 503 is equal to $I_{FB}/\beta^2$, where $\beta^2$ is a large number (e.g., $1 \times 10^4$). Thus, the presence of the Darlington connection 503 reduces the current $I_1$ passing through the feedback path 177 such that the current from the voltage-to-current conversion element 172 is closer to $I_{APD}$ passing through the APD 166. However, as a result of the Darlington connection 503, the voltage $V_2$ encounters a two-transistor $V_{be}$ voltage drop causing less precision in the setting of the voltage $V_{in}$.

It should be emphasized that the various embodiments described above are exemplary, and various changes and modifications to the described embodiments would be apparent to one of ordinary skill upon reading this disclosure.

Now, therefore, the following is claimed:

1. An avalanche photodiode (APD) biasing system, comprising:
   a current mirror having an input node and an output node;
   an avalanche photodiode (APD) coupled to the output node of the current mirror;
   a voltage-to-current converter coupled to the input node of the current mirror, the voltage-to-current converter configured to transmit current through the current mirror to the APD; and
   a feedback path coupled between the output node of the current mirror and the voltage-to-current converter, the feedback path configured to sense a voltage across the APD and provide, based on the sensed voltage, an input signal to the voltage-to-current converter for controlling the current transmitted by the voltage-to-current converter, wherein the feedback path is arranged to limit a voltage of the input signal such that the current transmitted by the voltage-to-current converter is limited thereby preventing damage to the APD.

2. The system of claim 1, wherein the feedback path comprises a differential amplifier.

3. The system of claim 2, wherein the voltage of the input signal is limited via saturation of the differential amplifier.

4. The system of claim 2, wherein the differential amplifier configured to determine a differential voltage between the sensed voltage and a reference voltage and transmit a value indicative of the differential voltage to the voltage-to-current converter.

5. The system of claim 1, wherein the feedback path comprises a voltage divider coupled to the output node and to an input of a differential amplifier, wherein the differential amplifier controls the input signal to the voltage-to-current converter.

6. The system of claim 1, wherein the feedback path further comprises at least one diode coupled to the voltage-to-current converter such that when a voltage of the input signal reaches a threshold, the diode redirects a portion of the current of the input signal to ground, thereby limiting the voltage of the input signal.

7. The system of claim 1, wherein the feedback path further comprises a diode and a voltage source producing a bias voltage coupled in series, wherein the diode is coupled to the voltage-to-current converter such that, when the input signal exhibits a voltage greater than a sum of a voltage drop across the diode and the bias voltage, the diode redirects a portion of a current of the input signal to ground, thereby limiting the voltage of the input signal.

8. The system of claim 1, wherein the current mirror and the voltage-to-current converter are arranged such that the current is received by the current mirror via the input node and is output from the current mirror via the output node.

9. An avalanche photodiode (APD) biasing method, comprising:
   transmitting a current, by a voltage-to-current converter, through a current mirror to an avalanche photodiode (APD) coupled to an output node of the current mirror;
   sensing a voltage across the APD via a feedback path coupled between the output node and the voltage-to-current converter; and
   providing, based on the sensed voltage, an input signal to the voltage-to-current converter;
   controlling the current transmitted by the voltage-to-current converter based on the input signal; and
   controlling the input signal such that the current is limited, thereby preventing damage to the APD.

10. The method of claim 9, further comprising providing the sensed voltage to a differential amplifier.

11. The method of claim 10, wherein the controlling comprises limiting a voltage of the input signal via saturation of the differential amplifier.

12. The method of claim 9, further comprising:
   determining, via the differential amplifier, a differential voltage between the sensed voltage and a reference voltage; and
   transmitting the input signal from the differential amplifier to the voltage-to-current converter, wherein the input signal is based on the differential voltage.

13. The method of claim 9, further comprising:
   redirecting a portion of the input signal current to ground through a diode when a voltage of the input signal reaches a threshold such that the voltage of the input signal is limited.

14. The method of claim 9, further comprising:
   redirecting a portion of the input signal current to ground, when the input signal exhibits a voltage greater than a sum of a voltage drop across a diode connected to the voltage-to-current converter and a bias voltage of a voltage source connected in series with the diode such that the voltage of the input signal is limited.

15. The method of claim 9, further comprising:
   receiving the current at an input node of the current mirror; and
   outputting the current from the current mirror via the output node.

* * * * *